US012630369B2

(12) United States Patent
Yamada

(10) Patent No.: US 12,630,369 B2
(45) Date of Patent: May 19, 2026

(54) OBJECT TRANSPORT SYSTEM

(71) Applicant: DAIFUKU CO., LTD., Osaka (JP)

(72) Inventor: Keita Yamada, Komaki (JP)

(73) Assignee: DAIFUKU CO., LTD., Osaka (JP)

( * ) Notice: Subject to any disclaimer, the term of this patent is extended or adjusted under 35 U.S.C. 154(b) by 259 days.

(21) Appl. No.: 18/349,605

(22) Filed: Jul. 10, 2023

(65) Prior Publication Data

US 2024/0034568 A1 Feb. 1, 2024

(30) Foreign Application Priority Data

Jul. 28, 2022 (JP) ................................ 2022-120731

(51) Int. Cl.
| | |
|---|---|
| *H01L 21/677* | (2006.01) |
| *B65G 17/20* | (2006.01) |
| *H10P 72/30* | (2026.01) |

(52) U.S. Cl.
CPC .......... *B65G 17/20* (2013.01); *H10P 72/3221* (2026.01)

(58) Field of Classification Search
CPC ................................................ H01L 21/67733
See application file for complete search history.

(56) References Cited

U.S. PATENT DOCUMENTS

| | | | | | |
|---|---|---|---|---|---|
| 4,826,360 | A * | 5/1989 | Iwasawa | ............. | H01L 21/6773 |
| | | | | | 414/217 |
| 7,234,584 | B2 * | 6/2007 | Rice | .................. | H01L 21/67778 |
| | | | | | 198/465.4 |

| | | | | | |
|---|---|---|---|---|---|
| 7,243,003 | B2 * | 7/2007 | Rice | .................. | H01L 21/67769 |
| | | | | | 414/217 |
| 7,506,746 | B2 * | 3/2009 | Rice | ................. | H01L 21/67733 |
| | | | | | 198/465.4 |
| 11,984,338 | B2 * | 5/2024 | Oh | ..................... | H01L 21/67733 |
| 2012/0114453 | A1 | 5/2012 | Ota et al. | | |
| 2012/0275886 | A1 | 11/2012 | Ota | | |
| 2013/0142597 | A1 * | 6/2013 | Kinugawa | ......... | H01L 21/67733 |
| | | | | | 414/281 |
| 2013/0199892 | A1 * | 8/2013 | Ota | ................... | H01L 21/67769 |
| | | | | | 198/347.2 |
| 2014/0068753 | A1 | 3/2014 | Gonzalez et al. | | |
| 2015/0057764 | A1 | 2/2015 | Gonzalez et al. | | |

(Continued)

FOREIGN PATENT DOCUMENTS

| | | | |
|---|---|---|---|
| JP | 2012-114406 A | 6/2012 |
| JP | 2013-153193 A | 8/2013 |

(Continued)

OTHER PUBLICATIONS

OED.com, Rail, noun2, https://www.oed.com/dictionary/rail_n2?tab=meaning_and_use#26947385, accessed Nov. 10, 2025 (Year: 2025).*

(Continued)

*Primary Examiner* — Gerald McClain

(74) *Attorney, Agent, or Firm* — Harness, Dickey & Pierce, P.L.C.

(57) ABSTRACT

In order to improve transport efficiency of an object transport system, an object transport system includes, a ceiling carrier configured to travel on at least travel rail and transport an object; and a transfer device including a hanging part configured to hang the object and configured to be capable of being raised and lowered, the transfer device being disposed so as to be separated from the ceiling carrier.

8 Claims, 8 Drawing Sheets

(56) References Cited

U.S. PATENT DOCUMENTS

| | | | |
|---|---|---|---|
| 2015/0110585 A1* | 4/2015 | Ota | H01L 21/67733 |
| | | | 414/222.13 |
| 2015/0170946 A1 | 6/2015 | Ota | |
| 2016/0071754 A1 | 3/2016 | Ota et al. | |
| 2018/0350646 A1 | 12/2018 | Honda et al. | |
| 2019/0006217 A1 | 1/2019 | Motoori | |
| 2019/0291752 A1* | 9/2019 | Takai | B61B 3/02 |
| 2020/0115160 A1 | 4/2020 | Maeda | |
| 2021/0043487 A1* | 2/2021 | Goto | B65G 1/06 |
| 2022/0073275 A1* | 3/2022 | Wada | H01L 21/6773 |
| 2024/0017931 A1* | 1/2024 | Motoori | H01L 21/67736 |

FOREIGN PATENT DOCUMENTS

| | | | |
|---|---|---|---|
| JP | 2015-527754 A | 9/2015 | |
| WO | 2013/183376 A1 | 12/2013 | |
| WO | WO-2014/017221 A1 | 1/2014 | |
| WO | 2017/029871 A1 | 2/2017 | |
| WO | 2017/098804 A1 | 6/2017 | |
| WO | 2018/225435 A1 | 12/2018 | |

OTHER PUBLICATIONS

Japanese Office Action for Japanese Patent Application No. 2022-120731 issued on May 27, 2025 and English machine translation thereof.

* cited by examiner

OBJECT TRANSPORT SYSTEM

This Nonprovisional application claims priority under 35 U.S.C. § 119 on Patent Application No. 2022-120731 filed in Japan on Jul. 28, 2022, the entire contents of which are hereby incorporated by reference.

TECHNICAL FIELD

The present invention relates to an object transport system that transports an object.

BACKGROUND ART

Conventionally known is an object transport system configured to transport an object along a travel rail disposed on a ceiling side. Regarding such an object transport system, Patent Literature 1 discloses a technique in which a transfer device configured to raise and lower an object is mounted in a ceiling carrier and is configured to transfer the object to and from a device port (processing device) disposed on a floor side.

CITATION LIST

Patent Literature

Patent Literature 1

International Publication No. WO 2014/017221

SUMMARY OF INVENTION

Technical Problem

However, in such a conventional technique described above, the ceiling carrier needs to stop at a predetermined stop position while the transfer device is transferring an object. Thus, while the object is being transferred, the ceiling carrier cannot start traveling. This has limited efficiency of the transport.

An aspect of the present invention is achieved in light of the conventional problem. It is an object of the aspect of the present invention to improve the transport efficiency of an object transport system.

Solution to Problem

In order to solve the foregoing problem, an object transport system in accordance with an aspect of the present invention includes: a ceiling carrier configured to travel on at least one travel rail and transport an object; and a transfer device including a hanging part configured to hang the object and configured to be capable of being raised and lowered, the transfer device being disposed so as to be separated from the ceiling carrier.

Advantageous Effects of Invention

According to an aspect of the present invention, it is possible to improve the transport efficiency of an object transport system.

DESCRIPTION OF EMBODIMENTS

Embodiment 1

Figure 1:
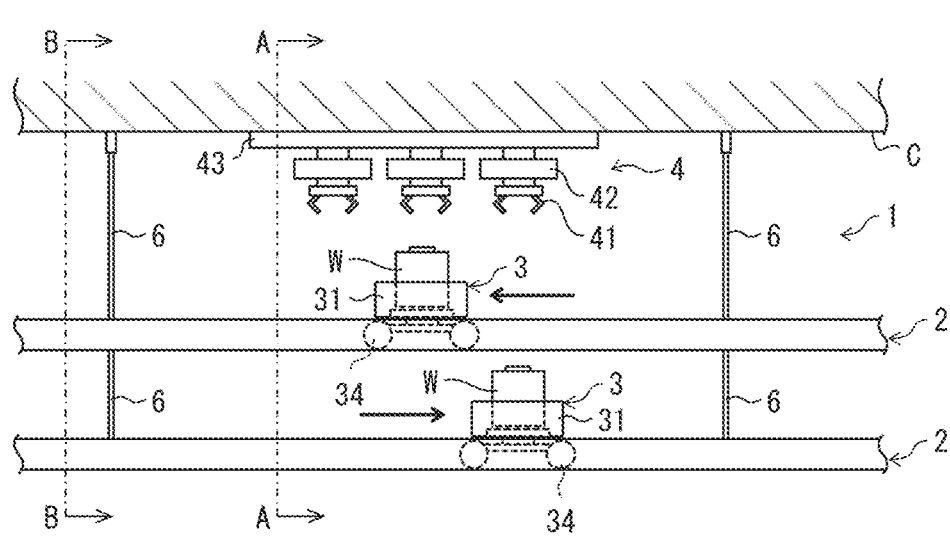
FIG. 1 is a side view schematically illustrating an object transport system in accordance with Embodiment 1.
Figure 1:
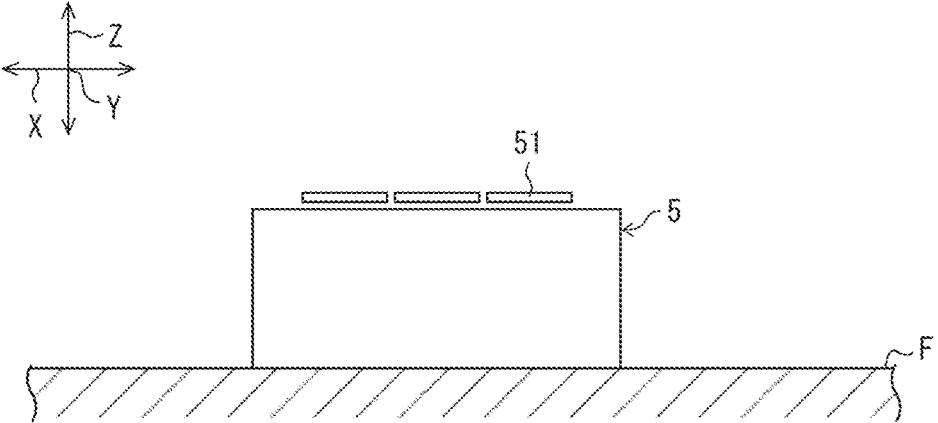

With reference to FIGS. 1 to 7, the following will describe an embodiment of the present invention. Note that the following description is an example of an object transport system in accordance with the present invention, and the technical scope of the present invention is not limited to examples in the drawings.

(Outline of Object Transport System 1)

First, with reference to FIG. 1, the following will describe an outline of an object transport system 1 in accordance with Embodiment 1. FIG. 1 is a side view schematically illustrating the object transport system 1 in accordance with Embodiment 1. As illustrated in FIG. 1, the object transport system 1 includes travel rails 2, ceiling carriers (carriages) 3, a transfer device 4, and a device port (object transfer part) 5. The ceiling carrier 3 that accommodates an object W travels along the travel rail 2 disposed on a ceiling C side, so that the object W is transported. The transfer device 4 is disposed on a ceiling C. The transfer device 4 includes hanging parts 41 each configured to hang the object W and each configured to be capable of being raised and lowered and is configured to transfer the object W between the ceiling carrier 3 and the device port 5 that is disposed on a floor F side.

In the object transport system 1, a transfer device is not mounted in a ceiling carrier unlike the conventional techniques, and the transfer device 4 and each of the ceiling carriers 3 are disposed so as to be separated from each other. Thus, the transport of the object W is performed by the ceiling carrier 3, and the transfer of the object W is performed by the transfer device 4, so that the transport of the object W and the transfer of the object W can be performed in parallel. Therefore, even while the transfer device 4 is transferring the object W, the ceiling carrier 3 can start traveling, for example, for subsequent work. This makes it possible to improve the efficiency of transporting the object W.

Note that, in the following descriptions, a direction along which the travel rails 2 run may be referred to as a transport direction X, a direction orthogonal to the transport direction X in plan view may be referred to as a width direction Y, and a direction orthogonal to the transport direction X and the width direction Y, that is, a direction in which each of the hanging parts 41 is raised and lowered may be referred to as an up-and-down direction Z.

Configuration of Object Transport System 1

Figure 2:
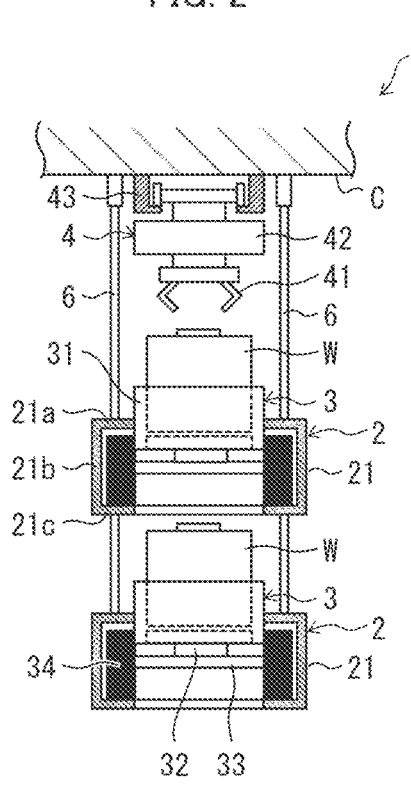
FIG. 2 is a cross-sectional view taken along the line A-A in FIG. 1.
Figure 2:
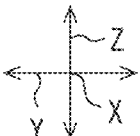
Figure 3:
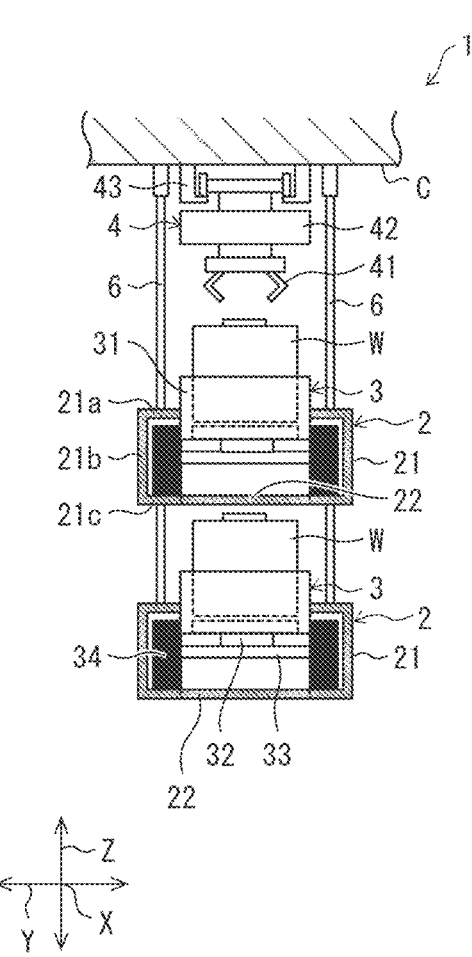
FIG. 3 is a cross-sectional view taken along the line B-B in FIG. 1.

Next, with reference to FIGS. 1 to 3, the following will describe the configuration of the object transport system 1 in accordance with Embodiment 1. FIG. 2 is a cross-sectional view taken along the line A-A in FIG. 1, and FIG. 3 is a cross-sectional view taken along the line B-B in FIG. 1.

As illustrated in FIG. 1, the travel rails 2 are disposed along respective routes of the ceiling carriers 3 and are hung by supports 6, for example, from a ceiling C side. In Embodiment 1, the plurality of travel rails 2 are disposed in the up-and-down direction Z. In an example illustrated in FIG. 1, the two travel rails 2 are disposed, one above the other, in two stages. Disposing the travel rails 2 in a plurality of stages in the up-and-down direction Z as described above can improve the efficiency of transporting the object W. In addition, the object transport system 1, in which the transfer device 4 and each of the ceiling carriers 3 are disposed so as to be separated from each other, reduces a height (that is, a width in the up-and-down direction Z) of each of the ceiling carriers 3, as compared with a conventional ceiling carrier in which a transfer device is mounted. Thus, it is possible to reduce a distance between the travel rails 2 disposed in the up-and-down direction Z. This makes it possible to reduce a space in which the travel rails 2 are disposed.

As illustrated in FIG. 2, each of the travel rails 2 includes a pair of rail members 21 that face each other in the width direction Y. The pair of rail members 21 each have an upper surface portion 21$a$, a side portion 21$b$, and a lower surface portion 21$c$. Each upper surface portion 21$a$ is disposed substantially parallel to the ceiling C and is connected with the support 6. Each side portion 21$b$ is a side wall disposed so as to hang down from one end which is of the upper surface portion 21$a$ and which is located on an outer side in the width direction Y. Each lower surface portion 21$c$ extends from a lower end of the side portion 21$b$ of one rail member 21 toward an inner wall surface of the side portion 21$b$ of the other rail member 21. The lower surface portion 21$c$ forms a track surface on which each of wheels 34 attached to the ceiling carrier 3 rolls.

As illustrated in FIG. 2, the pair of rail members 21 disposed at respective positions below the transfer device 4 are separated from each other in the width direction Y. This allows the hanging part 41 to, as described later, be raised and lowered while passing through the space between the pair of rail members 21 in a state where the hanging part 41 hangs the object W. Further, as illustrated in FIG. 3, the pair of rail members 21 disposed at respective positions that are not below the transfer device 4 may be partly connected with each other. In an example illustrated in FIG. 3, the lower surface portions 21$c$ of the pair of rail members 21 are connected with each other by a connecting board 22. Connecting, as described above, the pair of rail members 21 with each other at a portion where the hanging parts 41 are not raised and lowered while passing through a space between the pair of rail members 21 can reinforce the travel rail 2 and increase the strength of the travel rail 2.

The ceiling carrier 3 includes an accommodation part 31, a power unit 32, power transmission shafts 33, and wheels 34. The accommodation part 31 is a housing having an opening facing upward and is configured to accommodate the object W. The power unit 32 is a power source for driving the wheels 34 and is constituted by a motor and the like. The power unit 32 is attached to a lower portion of the accommodation part 31. The power unit 32 transmits power to the two power transmission shafts 33. The power unit 32 can switch a rotation direction thereof between a positive rotation and a negative rotation. Thus, switching the rotation direction of the power unit 32 allows the ceiling carrier 3 to travel toward either side of the transport direction X. To the ceiling carrier 3, the four wheels 34 are attached. Each of the wheels 34 is fixed to each of both ends of each of the power transmission shafts 33. Upon receiving the power from the power unit 32, the wheels 34 rotate, and roll on the lower surface portions 21$c$ of the travel rail 2.

The transfer device 4 is disposed on the ceiling C and is configured to transfer the object W between the ceiling carrier 3 and the device port 5. Specifically, the transfer device 4 is disposed at a higher position than the travel rails 2 and is configured to deliver the object W to and from the device port 5 disposed at a lower position than the travel rails 2.

The transfer device 4 includes: hanging parts 41 each configured to hang (hold) the object W; driving parts 42 each configured to raise and lower the hanging part 41 in the up-and-down direction Z; and a base 43 to which the driving parts 42 are attached. In Embodiment 1, the transfer device 4 includes the three hanging parts 41 arranged side by side along the transport direction X. These three hanging parts 41 are connected with the corresponding three driving parts 42 attached to the base 43. The hanging parts 41 are connected with the corresponding driving parts 42 via a wire 44 (see FIG. 6). Controlling the driving parts 42 enables the corresponding hanging parts 41 to be individually moved (raised and lowered) along the up-and-down direction Z. With the base 43 fixed to the ceiling C, the transfer device 4 is disposed on the ceiling C.

Note that the transfer device 4 only needs to be disposed at a higher position than the travel rails 2. Thus, the transfer device 4 may be disposed on the ceiling C in a space in which the object transport system 1 is disposed or may be disposed on a side wall in proximity to the ceiling C.

The device port 5 is disposed on a floor F and delivers the object W to and from the hanging parts 41. The device port is connected with a processing device (not illustrated) configured to process the object W. The device port 5 includes a placement part 51 on which the object W is to be placed. In the example illustrated in FIG. 1, three placement parts 51 corresponding to the three hanging parts 41 are disposed along the transport direction X. The three hanging parts 41 and the three placement portions 51 are positioned such that each of the hanging parts 41 faces the corresponding one of the three placement portions 51 in the up-and-down direction Z.

Control of Object Transport System 1

Figure 4:
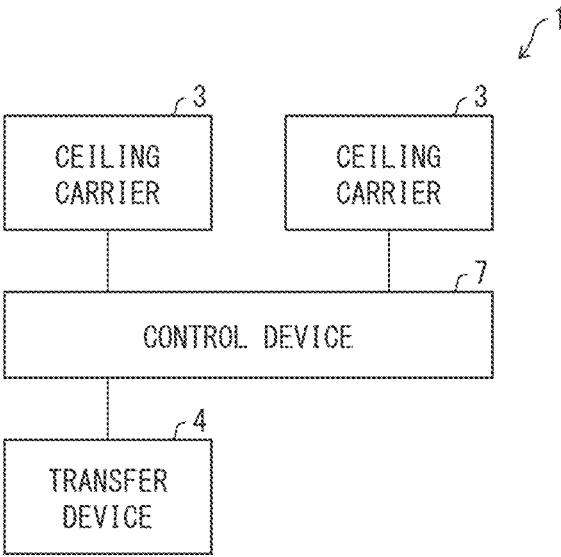
FIG. 4 is a view illustrating control blocks of the object transport system illustrated in FIG. 1.

Next, with reference to FIGS. 4 to 7, the following will describe an example of control of the object transport system 1. FIG. 4 is a view illustrating control blocks of the object transport system 1. As illustrated in FIG. 4, the object transport system 1 further includes a control device 7 configured to control the ceiling carrier 3 and the transfer device 4. The control device 7 is configured to centrally control the operations of the components and is constituted, for example, by a computer including a central processing unit (CPU) and a memory. The operations of the components are controlled by causing the computer to execute a control program.

Figure 5:
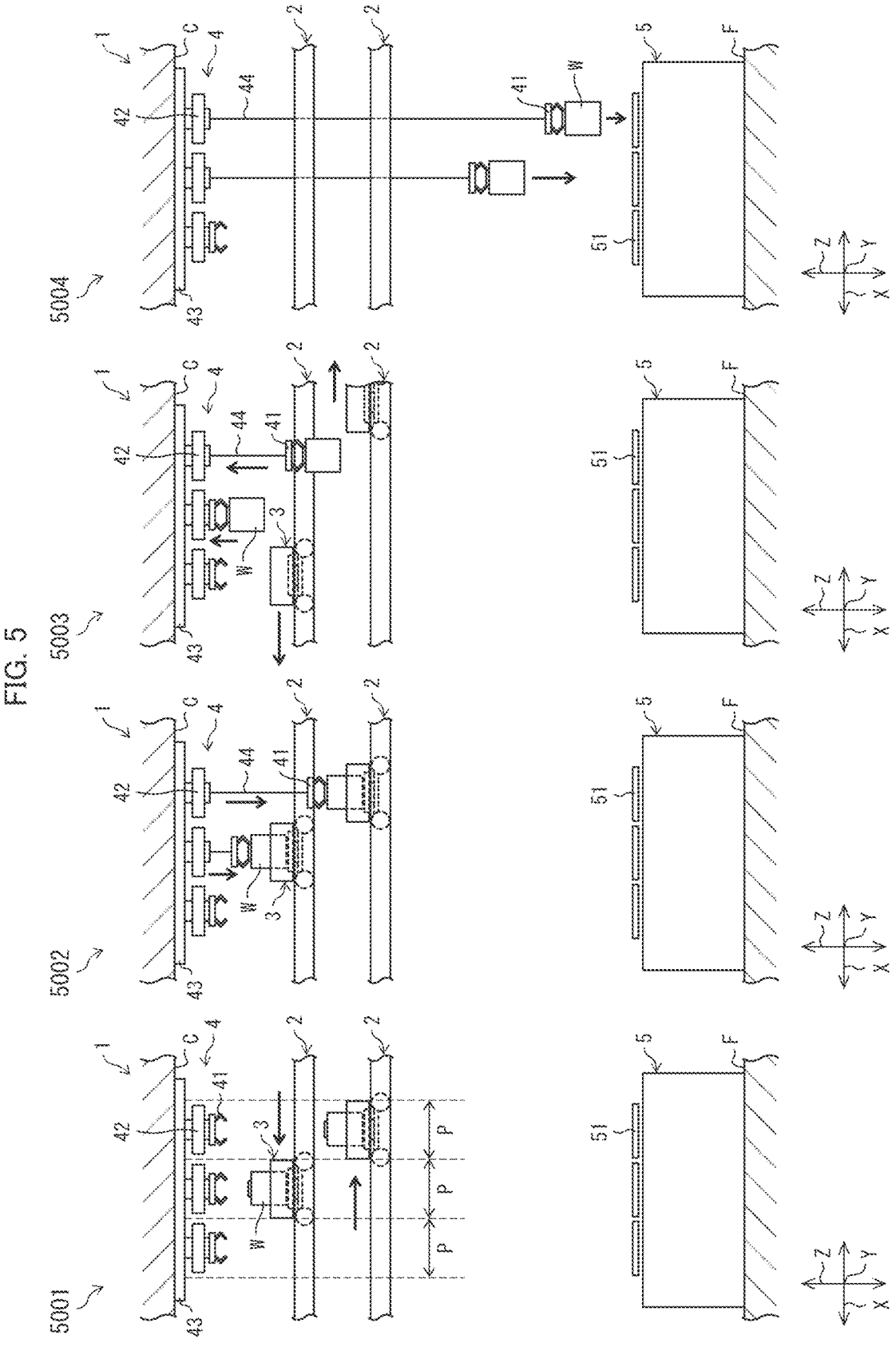
FIG. 5 is a side view illustrating an example of an operation of the object transport system illustrated in FIG. 1.

First, with reference to FIG. 5, the following will describe a transfer control for transferring the object W from the ceiling carrier 3 to the device port 5. FIG. 5 is a side view illustrating an example of the transfer operation of the objects W from the ceiling carriers 3 to the device port 5. The control device 7 controls the ceiling carriers 3 and the transfer device 4 on the basis of control information from a host controller (not illustrated) to perform the following operations. Note that the ceiling carriers 3 can communicate with the device port 5, so that, during the transfer, the ceiling carriers 3 and the transfer device 4 operate in cooperation with the operation of the device port 5.

As illustrated in 5001 of FIG. 5, the control device 7 controls the ceiling carriers 3 each accommodating the object W to cause the ceiling carriers 3 to stop at respective stop positions P set below the transfer device 4. The stop positions P are set, for the individual hanging parts 41, below the hanging parts 41 which are positioned at respective waiting positions (for example, the highest positions to which the hanging parts 41 are raised). In the example illustrated in FIG. 5, the three stop positions P corresponding to the three hanging parts 41 are set for each of the travel rails 2 which are disposed, one above the other, in two stages.

Next, as illustrated in 5002 of FIG. 5, the control device 7 controls the driving parts 42 to lower, from the respective waiting positions, the hanging parts 41 which are positioned above the corresponding ceiling carriers 3 stopping at the stop positions P. In this case, depending on whether each of the ceiling carriers 3 stops at a stop position P on the upper travel rail 2 or at a stop position P on the lower travel rail 2, the control device 7 adjusts amounts by which the hanging parts 41 are to be lowered. Accordingly, the control device 7 causes the hanging parts 41 to stop immediately above the corresponding objects W. Then, the control device 7 controls the hanging parts 41 to cause the hanging parts 41 to hold respective upper portions of the objects W.

Subsequently, as illustrated in 5003 of FIG. 5, the control device 7 controls the driving parts 42 to cause the driving parts 42 to raise the hanging parts 41 holding the objects W. Accordingly, the hanging parts 41 hang the objects W, and the objects W are taken out of the ceiling carriers 3. Then, when the hanging parts 41 have been raised to respective positions which are so high that the objects W do not interfere with the travel of the ceiling carriers 3, that is, when lower ends of the objects W have been positioned at higher positions than upper ends of the ceiling carriers 3, the control device 7 controls the ceiling carriers 3 to cause the ceiling carriers 3 to move from the stop positions P. In this moment, the control device 7 may cause the ceiling carriers 3 to start travelling for subsequent work.

As such, the ceiling carriers 3 stop at the respective stop positions P below the hanging parts 41, and after the objects W are hung by the hanging parts 41, the ceiling carriers 3 start traveling. This enables the ceiling carrier 3 to start travelling even while the hanging part 41 is transferring the object W, and thus it is possible to improve the efficiency of transporting the object W.

Subsequently, as illustrated in 5004 of FIG. 5, the control device 7 controls the driving parts 42 to lower the hanging parts 41 holding the objects W. In this case, each of the hanging parts 41 is lowered through the space between the pair of rail members 21 in a state where the hanging parts 41 hold the objects W.

Figure 6:
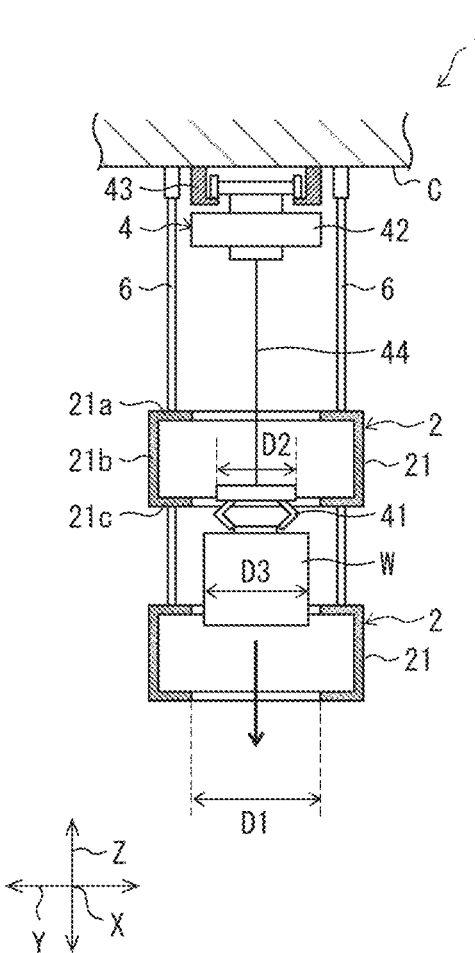
FIG. 6 is a front view illustrating a state where a hanging part illustrated in FIG. 1 is being lowered through a space between a pair of rail members.

FIG. 6 is a front view illustrating a state where the hanging part 41 is being lowered while passing through the space between the pair of rail members 21. As illustrated in FIG. 6, in the width direction Y, a distance D1 between the pair of rail members 21 is larger than each of a width D2 of the hanging part 41 and a width D3 of the object W. Thus, the hanging part 41 can be raised and lowered while passing through the space between the pair of rail members 21 in a state where the hanging part 41 holds the object W. Thus, even though the travel rail 2 is disposed between the transfer device 4 and the device port 5, it is possible to perform delivery of the object W from the transfer device 4 to the device port 5 and vice versa.

While the hanging part 41 delivers the object W to and from the device port 5, the ceiling carriers 3 are restricted from entering the stop positions P set below the hanging part 41. This can prevent the ceiling carriers 3 from colliding with the hanging part 41 or the wire 44.

Then, the control device 7 causes the hanging part 41 to stop immediately above the placement portion 51 of the device port 5 and then place the object W onto the placement portion 51. After the object W has been placed onto the placement portion 51, the control device 7 causes the hanging part 41 to be raised to the waiting position and ends the transfer control of the object W from the ceiling carrier 3 to the device port 5.

Figure 7:
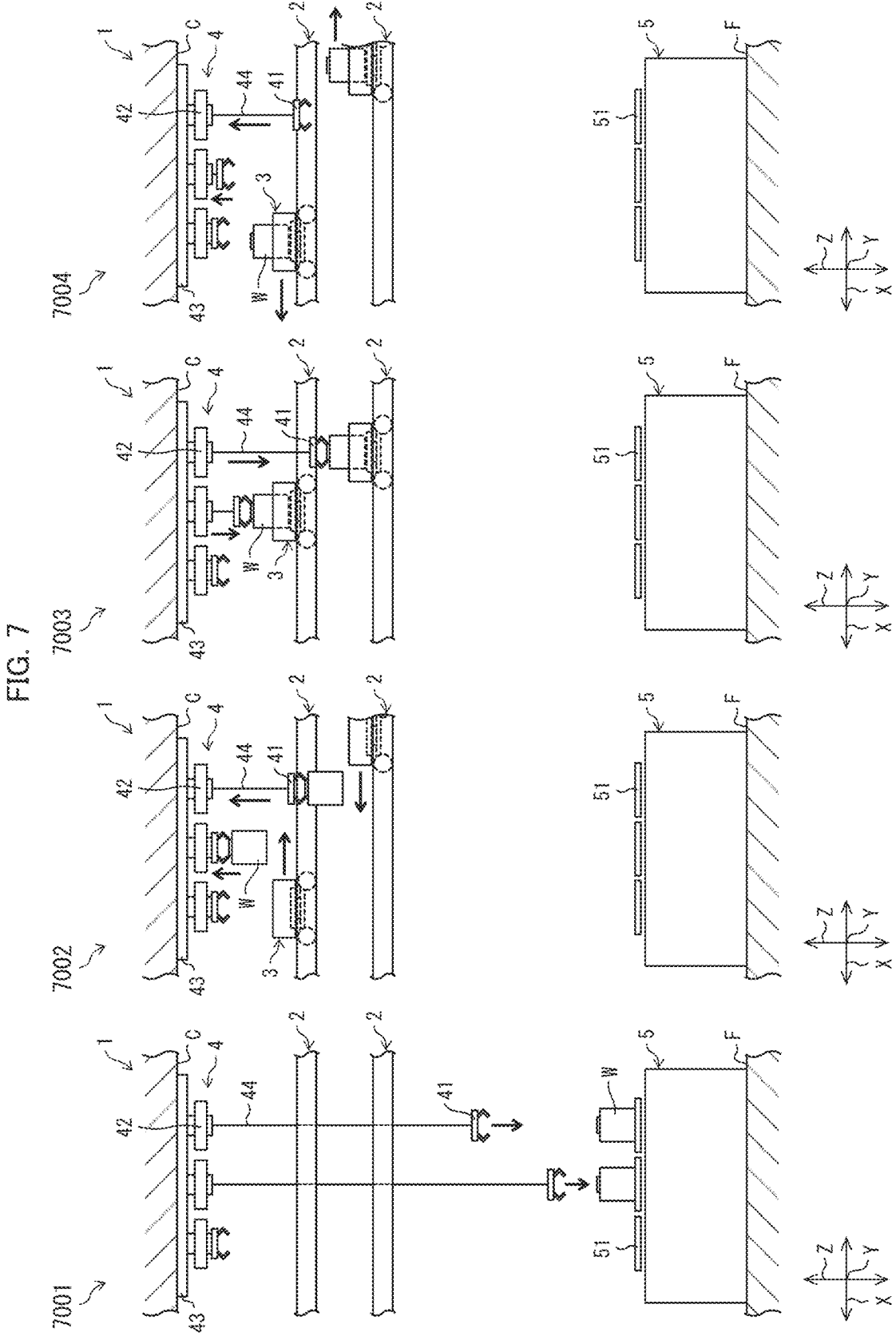
FIG. 7 is a side view illustrating an example of another operation of the object transport system illustrated in FIG. 1.

Next, with reference to FIG. 7, the following will describe transfer control of the objects W from the device port 5 to the ceiling carriers 3. FIG. 7 is a side view illustrating an example of the transfer operation of the objects W from the ceiling carriers 3 to the device port 5.

As illustrated in 7001 of FIG. 7, in a case where the objects W have been placed on the corresponding placement portions 51 of the device port 5, the control device 7 controls the driving parts 42 to lower, from the respective waiting positions, the hanging parts 41 positioned above the corresponding placement portions 51 on which the objects W are placed.

Subsequently, as illustrated in 7002 of FIG. 7, the control device 7 controls the hanging parts 41 to cause the hanging parts 41 to hold upper portions of the objects W, and then controls the driving parts 42 to raise the hanging parts 41 holding the objects W. Then, when the hanging parts 41 have been raised to respective positions which are so high that the objects W do not interfere with the travel of the ceiling carriers 3, the control device 7 controls the ceiling carriers 3 to cause the ceiling carriers 3 to stop at the respective stop positions P located below the hanging parts 41 holding the objects W.

As such, the hanging parts 41 are raised after having received the objects W from the device port 5, and continue to hang the objects W until the ceiling carriers 3 arrive at respective positions below the hanging parts 41. Thus, while the hanging part 41 is receiving an object W from the device port 5, the ceiling carrier 3 can, for example, transport another object W. This makes it possible to improve the efficiency of transporting the object W.

Subsequently, as illustrated in 7003 of FIG. 7, the control device 7 controls the driving parts 42 to lower the hanging parts 41 holding the objects W so that the corresponding ceiling carriers 3 accommodate the objects W.

Subsequently, as illustrated in 7004 of FIG. 7, the control device 7 controls the driving parts 42 to raise the hanging parts 41. Then, when the hanging parts 41 have been raised to respective positions which are so high that the hanging parts 41 do not interfere with the travel of the ceiling carriers 3, the control device 7 controls the ceiling carriers 3 to cause the ceiling carriers 3 to start travelling toward respective next destinations of the objects W. Then, the control device 7 causes the hanging parts 41 to be raised to the respective waiting positions and ends the transfer control of the objects W from the device port 5 to the ceiling carriers 3.

As such, the object transport system 1 makes it possible for the ceiling carriers 3 to start traveling towards respective next destinations of the objects W even while the hanging parts 41 are operating. Thus, the transport of the object W and the transfer of the object W can be performed in parallel. This makes it possible to improve the efficiency of transporting the object W.

(Effect of Object Transport System 1)

As described above, the object transport system 1 in accordance with Embodiment 1 includes: the ceiling carriers 3 each configured to travel on the travel rail 2 and transport the object W; and the transfer device 4 that includes the hanging parts 41 each configured to hang the object W and each configured to be capable of being raised and lowered, the transfer device 4 being disposed so as to be separated from the ceiling carriers 3.

In the object transport system 1, the ceiling carriers 3 are separated from the transfer device 4. Thus, it is possible for the ceiling carriers 3 to start travelling even while the transfer device 4 is transferring the object W. Therefore, it is possible to achieve an object transport system 1 having improved efficiency of transporting the object W.

In addition, the object transport system 1 makes it possible to reduce a weight of the ceiling carrier 3 as compared with a conventional ceiling carrier in which a transfer device is mounted. Therefore, it is possible to set a high traveling speed for the ceiling carrier 3 or to reduce an energy consumption of the ceiling carrier 3.

Further, in the object transport system 1, the transfer device 4 and the device port 5 are paired with each other and are disposed in a one-to-one relationship. Thus, disposing the transfer device 4 and the device port 5 at optimum positions at the installation of the object transport system 1 eliminates, even in a case where an additional ceiling carrier 3 is provided after the installation, the need for causing the transfer device 4 to learn the position and height of the device port 5. In addition, in a case where, for example, the transfer devices 4 and the device ports 5 are provided in a plurality of pairs, the transfer devices 4 can be positioned to be disposed for the corresponding device ports 5 at optimum positions. Thus, transfer accuracy can be easily improved.

Embodiment 2

Figure 8:
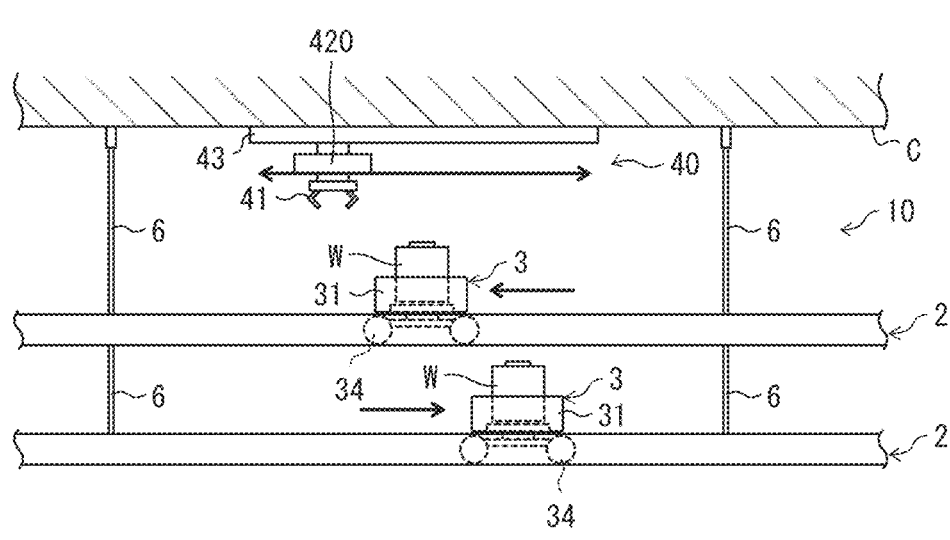
FIG. 8 is a side view schematically illustrating an object transport system in accordance with Embodiment 2.
Figure 8:
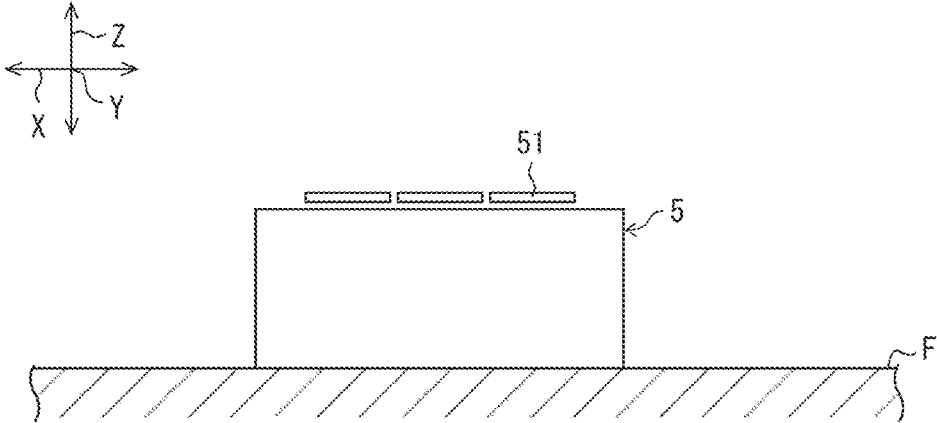
Figure 9:
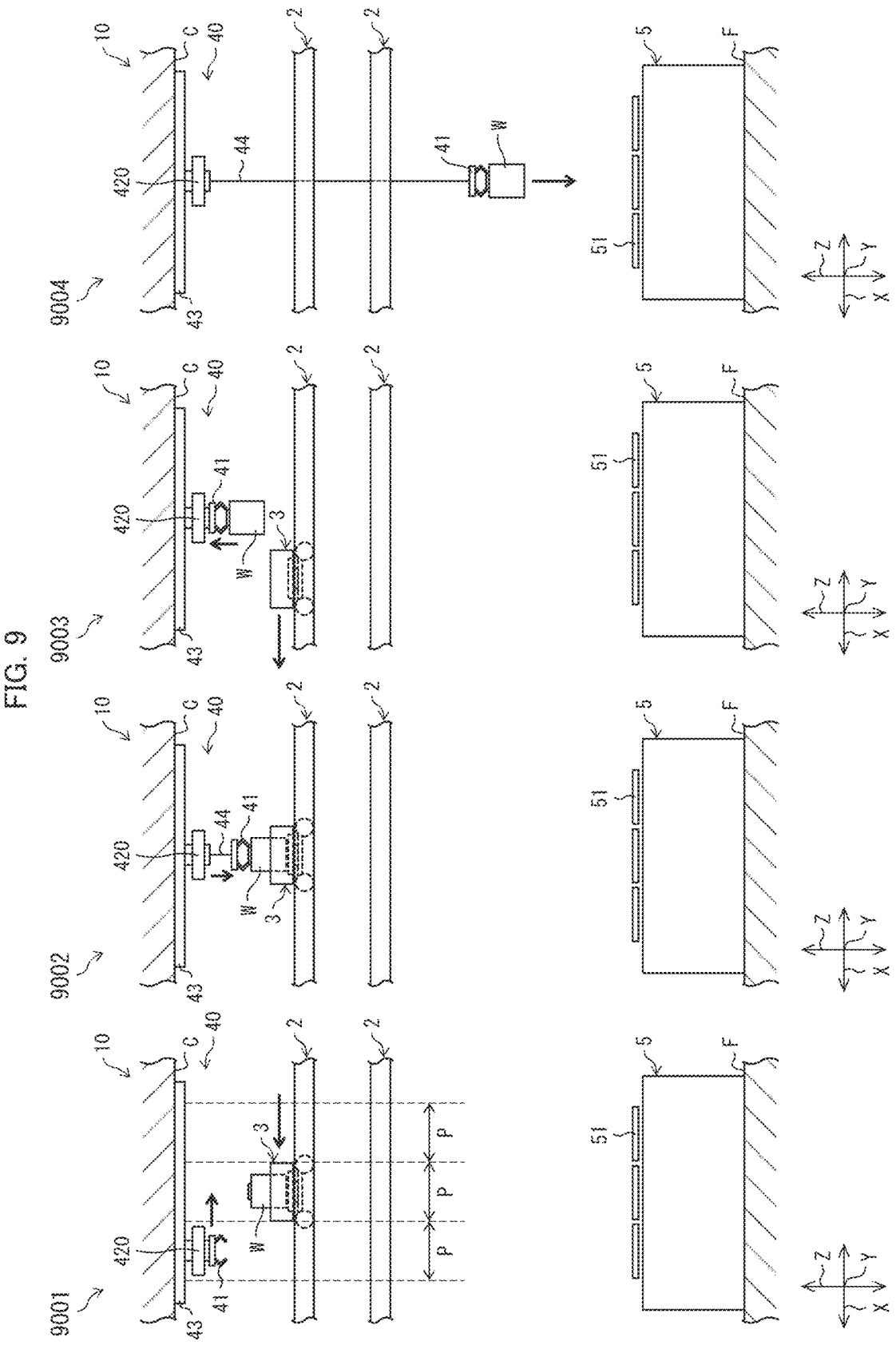
FIG. 9 is a side view illustrating an example of an operation of the object transport system illustrated in FIG. 8.

With reference to FIGS. 8 and 9, the following will describe another embodiment of the present invention. For convenience of description, a member having a function identical to that of a member discussed in Embodiment 1 above is given an identical reference sign, and a description thereof is omitted.

(Configuration of Object Transport System 10)

First, with reference to FIG. 8, the following will describe a configuration of an object transport system 10 in accordance with Embodiment 2. FIG. 8 is a side view schematically illustrating the object transport system 10 in accordance with Embodiment 2. As illustrated in FIG. 8, the object transport system 10 includes a transfer device 40 including a hanging part 41 configured to be capable of moving in the transport direction X. The object transport system 10 is configured in the same manner as the object transport system 1 described above except that the object transport system 10 includes the transfer device 40.

The transfer device 40 includes: a hanging part 41 configured to hang (hold) an object W; a driving part 420 configured to move the hanging part 41 in the transport direction X and the up-and-down direction Z; and a base 43 to which the driving part 420 is attached. In Embodiment 2, the transfer device 40 includes the single hanging part 41. The driving part 420 with which the hanging part 41 is connected is attached to the base 43 such that the driving part 420 can move along the transport direction X. Thus, controlling the driving part 420 enables the hanging part 41 to move along the transport direction X and to be raised and lowered along the up-and-down direction Z. This makes it possible to transfer, with use of the single hanging part 41, the objects W at respective plurality of stop positions P (or on respective plurality of placement portions) arranged side by side along the transport direction X. Thus, it is possible to reduce the number of the hanging parts 41 provided.

Note that the hanging part 41 may be configured to be capable of moving not only in the transport direction X but also in the width direction Y. Thus, even in a case where, for example, a plurality of device ports 5 (placement portions 51) are disposed along the transport direction X and the width direction Y, it is possible to perform delivery of the object W from a transfer device 40 to each of the device ports 5 and vice versa by causing the hanging part 41 to move to a position above each of the device ports 5.

(Control of Object Transport System 10)

Next, with reference to FIG. 9, the following will describe an example of control of the object transport system 10. FIG. 9 is a side view illustrating an example of the operation of transferring the object W from a ceiling carrier 3 to the device port 5.

As illustrated in 9001 of FIG. 9, the control device 7 controls the ceiling carrier 3 accommodating the object W to stop the ceiling carrier 3 at a stop position P set below the transfer device 40, and controls the driving part 420 to move the hanging part 41 to a position above the stop position P.

Subsequently, as illustrated in 9002 of FIG. 9, the control device 7 controls the driving part 420 to lower the hanging part 41 from a waiting position. Then, the control device 7 controls the hanging part 41 to cause the hanging part 41 to hold upper portion of the object W.

Subsequently, as illustrated in 9003 of FIG. 9, the control device 7 controls the driving part 420 to cause the hanging part 41 holding the object W to be raised. Accordingly, the hanging part 41 hangs the object W, and the object W is taken out of the ceiling carrier 3. Then, when the hanging part 41 has been raised to a position which is so high that the object W does not interfere with the travel of the ceiling carrier 3, the control device 7 controls the ceiling carrier 3 to cause the ceiling carrier 3 to move from the stop position P. As such, even while the hanging part 41 is transferring the object W, the ceiling carrier 3 can start travelling. This makes it possible to improve the efficiency of transporting the object W.

Subsequently, as illustrated in 9004 of FIG. 9, the control device 7 controls the driving part 420 to cause the hanging part 41 holding the object W to be lowered so that the object W is placed onto the placement portion 51. After the object W has been placed onto the placement portion 51, the control device 7 causes the hanging part 41 to be raised to the waiting position and ends the transfer control of the object W from the ceiling carrier 3 to the device port 5.

Aspects of the present invention can also be expressed as follows:

An object transport system according to Aspect 1 of the present invention includes: a ceiling carrier configured to travel on at least one travel rail and transport an object; and a transfer device including a hanging part configured to hang the object and configured to be capable of being raised and lowered, the transfer device being disposed so as to be separated from the ceiling carrier.

In the above configuration, the transfer device is not mounted in the ceiling carrier unlike the conventional techniques, and the ceiling carrier and the transfer device are disposed so as to be separated from each other. Thus, the transport of an object is performed by the ceiling carrier, and the transfer of the object is performed by the transfer device. This makes it possible to separately perform the transport of the object and the transfer of the object. Therefore, according to the above configuration, even while the transfer device is transferring an object, the ceiling carrier can start travelling, for example, for subsequent work. This makes it possible to improve the efficiency of transporting the object.

An object transport system according to Aspect 2 of the present invention may be configured, in Aspect 1, such that, in a case where a direction in which the hanging part is raised and lowered is an up-and-down direction, the transfer device is disposed at a higher position than the travel rail and is configured to deliver the object to and from an object transfer part (device port 5) disposed at a lower position than the travel rail.

In the above configuration, the transfer device, the travel rail, and the object transfer part are disposed in this order from above. Therefore, according to the above configuration, the hanging part can hang an object from above the ceiling carrier configured to travel on the travel rail and can deliver the object to and from the object transfer part.

An object transport system according to Aspect 3 of the present invention may be configured, in Aspect 1 or 2, such that: the travel rail includes a pair of rail members; and the hanging part is raised and lowered while passing through a space between the pair of rail members in a state where the hanging part hangs the object.

According to the above configuration, even though the travel rail is disposed between the transfer device and the object transfer part, it is possible to perform delivery of an object from the transfer device to the object transfer part and vice versa.

An object transport system according to Aspect 4 of the present invention may be configured, in Aspect 3, such that: a stop position at which the ceiling carrier stops is set below the hanging part; and the ceiling carrier is restricted from entering the stop position while the hanging part delivers the object to and from the object transfer part.

According to the above configuration, it is possible to prevent the ceiling carrier from colliding with the hanging part or a wire hanging the hanging part.

An object transport system according to Aspect 5 of the present invention may be configured, in Aspects 2 to 4, such that the at least one travel rail includes a plurality of travel rails which are disposed in the up-and-down direction.

According to the above configuration, it is possible to improve the efficiency of transporting an object. In addition, in the above configuration, the ceiling carrier and the transfer device are disposed so as to be separated from each other. Thus, the height (the width in an up-and-down direction) of the ceiling carrier can be reduced as compared with a conventional ceiling carrier in which a transfer device is mounted. This makes it possible to reduce a distance between the plurality of travel rails disposed in an up-and-down direction, and thus it is possible to reduce a space in which the travel rails are disposed.

An object transport system according to Aspect 6 of the present invention may be configured, in Aspects 2 to 5, such that the hanging part is provided so as to face the object transfer part in the up-and-down direction.

According to the above configuration, raising and lowering the hanging part makes it possible to perform delivery of an object from the transfer device to the object transfer part and vice versa.

An object transport system according to Aspect 7 of the present invention may be configured, in Aspects 2 to 5, such that the hanging part is configured to be capable of moving in a direction orthogonal to the up-and-down direction.

According to the above configuration, for example, even in a case where the plurality of object transfer parts are provided, it is possible for the transfer device to deliver an object to and from each of the object transfer parts by causing the hanging part to move to a position above the object transfer part.

An object transport system according to Aspect 8 of the present invention may be configured, in Aspects 2 to 7, such that the ceiling carrier is configured to stop at a position below the transfer device and, after the object accommodated by the ceiling carrier has been hung by the hanging part, start traveling.

According to the above configuration, even while the hanging part is transferring an object, the ceiling carrier can start travelling. This makes it possible to improve the efficiency of transporting the object.

An object transport system according to Aspect 9 of the present invention may be configured, in Aspects 2 to 8, such that the hanging part is configured to, after having received the object from the object transfer part, be raised and continue to hang the object until the ceiling carrier arrives at a position below the hanging part.

The above configuration allows the ceiling carrier to, for example, transport an object while the hanging part is receiving another object from the object transfer part. Thus, according to the above configuration, it is possible to perform the transport of an object and the transfer of the object in parallel. This makes it possible to improve the efficiency of transporting the object.

An object transport system according to Aspect 10 of the present invention may be configured, in Aspects 1 to 9, such that the transfer device is disposed on a ceiling or side wall in an installation space in which the object transport system is installed.

The transfer device only needs to be separated from the ceiling carrier and thus can be disposed, for example, on a ceiling in the installation space in which the object transport system is install or on a side wall in proximity to the ceiling.

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST

1, 10 Object transport system
2 Travel rail
3 Ceiling carrier
4, 40 Transfer device
5 Device port (object transfer part)
21 Rail member
41 Hanging part
P Stop position
Z Up-and-down direction

The invention claimed is:

1. An object transport system comprising:
a ceiling carrier configured to travel on at least one travel rail suspended from a ceiling and transport an object; and
a transfer device including a hanging part configured to hold the object and configured to be capable of being raised and lowered, the transfer device being disposed so as to be separated from the ceiling carrier, wherein, in a case where a direction in which the hanging part is raised and lowered is an up-and-down direction, the transfer device is disposed at a higher position than the travel rail and is configured to deliver the object to and from an object transfer part disposed at a lower position than the travel rail wherein the at least one travel rail comprises a plurality of travel rails which are disposed in the up-and-down direction.

2. The object transport system according to claim 1, wherein:

the travel rail includes a pair of rail members; and the hanging part is raised and lowered while passing through a space between the pair of rail members in a state where the hanging part hangs the object.

3. The object transport system according to claim 2, wherein:

a stop position at which the ceiling carrier stops is set below the hanging part, and the ceiling carrier is restricted from entering the stop position while the hanging part delivers the object to and from the transfer part.

4. The object transport system according to claim 1, wherein the hanging part is provided so as to face the object transfer part in the up-and-down direction.

5. The object transport system according to claim 1, wherein the hanging part is configured to be capable of moving in a direction orthogonal to the up-and-down direction.

6. The object transport system according to claim 1, wherein the ceiling carrier is configured to stop at a position below the hanging part and, after the object accommodated by the ceiling carrier has been hung by the hanging part, start traveling.

7. The object transport system according to claim 1, wherein the hanging part is configured to, after having received the object from the object transfer part, be raised and continue to hang the object until the ceiling carrier arrives at a position below the hanging part.

8. The object transport system according to claim 1, wherein the transfer device is disposed on a ceiling or side wall in an installation space in which the object transport system is installed.

* * * * *